United States Patent
Huang et al.

(10) Patent No.: US 8,692,304 B2
(45) Date of Patent: Apr. 8, 2014

(54) IMAGE SENSOR

(75) Inventors: Fang-Ming Huang, Grand Cayman (KY); Chung-Wei Chang, Grand Cayman (KY); Ping-Hung Yin, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 94 days.

(21) Appl. No.: 12/849,027

(22) Filed: Aug. 3, 2010

(65) Prior Publication Data

US 2012/0032241 A1    Feb. 9, 2012

(51) Int. Cl.
*H01L 31/062*    (2012.01)

(52) U.S. Cl.
USPC ..... 257/294; 257/292; 257/436; 257/E31.127

(58) Field of Classification Search
USPC ......... 257/184, 257, 258, 290, 291, 292, 294, 257/431, 447, 457, 458, 459, 460, 461, 462, 257/E31.121, E31.124, E31.127
See application file for complete search history.

(56) References Cited

U.S. PATENT DOCUMENTS

| | | | |
|---|---|---|---|
| 7,265,328 B2* | 9/2007 | Mouli | 250/208.1 |
| 7,425,760 B1* | 9/2008 | Guenin et al. | 257/698 |
| 7,459,735 B2* | 12/2008 | Ezaki et al. | 257/292 |
| 7,919,798 B2* | 4/2011 | Lee | 257/294 |
| 7,994,032 B2* | 8/2011 | Chiang et al. | 438/558 |
| 2005/0056901 A1* | 3/2005 | Kuriyama | 257/428 |
| 2007/0034980 A1* | 2/2007 | Sekiguchi | 257/462 |
| 2007/0052056 A1* | 3/2007 | Doi et al. | 257/462 |
| 2009/0065821 A1* | 3/2009 | Lee | 257/292 |
| 2010/0112747 A1* | 5/2010 | Akiyama | 438/72 |
| 2010/0193845 A1* | 8/2010 | Roy et al. | 257/228 |
| 2011/0266645 A1* | 11/2011 | Chao | 257/432 |

* cited by examiner

*Primary Examiner* — Eduardo A Rodela
(74) *Attorney, Agent, or Firm* — Winston Hsu; Scott Margo

(57) ABSTRACT

An image sensor includes: a substrate, at least a pixel, and at least a light shield is provided. Wherein the pixel includes a photodiode and at least a transistor, and the transistor is connected to a metal line via a contact. The light shield is positioned around at least one side of the pixel, wherein the light shield is made while forming the contact.

10 Claims, 5 Drawing Sheets

IMAGE SENSOR

BACKGROUND OF THE INVENTION

1. Field of the Invention

The present invention relates to sensors, and more particularly, to image sensors.

2. Description of the Prior Art

Digital cameras are commonly used today. Typically, a digital camera contains image sensors which convert light into electrical charges. These image sensors can be divided into two broad categories according to the applied manufacturing process: CCD (Charge-Coupled Device) sensors; and CMOS (Complementary Metal Oxide Semiconductor) image sensors, where the CMOS image sensors (CIS) are based on CMOS technologies. Since the CMOS image sensors are compatible with typical CMOS fabrication processes, an integration of additional signal processing logic on the same substrate on which the sensor array is disposed is permitted.

In addition, the trend is for the pixel sizes of the CMOS image sensors to become smaller and smaller; however, these reduced sizes of pixels and pixel arrays affect the performance of the CIS system.

The CIS system traditionally applies Front Side Illumination (FSI) technology to form the pixels of the pixel array. In FSI CMOS image sensors, light travels to a photo-sensing area through the front side of the pixel. This means that the incident light has to first pass through dielectric layers, and metal layers before it strikes the photo-sensing area, causing low quantum efficiency (QE), serious cross talk between pixels, and dark current.

Another type of CMOS image sensor is BSI (Back Side illumination) CMOS image sensors. Back Side illumination technology was used in pixels of CCD image sensors. Instead of illuminating a CMOS image sensor from the top (front) side of the silicon die, a BSI CMOS image sensor applies the color filters and the microlens to the back side of the pixels so that the incident light is collected from the back side of the image sensor. Compared to the FSI CMOS image sensors, the BSI CMOS image sensors have less light loss, reduced crosstalk, and better quantum efficiency.

Both the FSI CMOS image sensors and BSI CMOS image sensors, however, need to improve their performance and reduce their disadvantages such as cross talk, and light loss. Therefore, there is a demand for the provision of CMOS image sensors with better performance.

SUMMARY OF THE INVENTION

One objective of the present invention is therefore to provide a novel structure of image sensors to improve quantum efficiency and the performance of CMOS image sensors. The present invention provides a light shield(s) into the CMOS image sensors, the light shield(s) being positioned around at least one side of the pixel, to reflect the portion of the incident light striking the light shield back to the corresponding pixel, thereby effectively promoting quantum efficiency together with less cross talk and reduced light loss.

According to another aspect of the present invention, an image sensor is presented. The image sensor comprises: a substrate; at least a pixel; and at least a light shield, positioned around at least one side of the pixel wherein the light shield is made while forming the contact.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
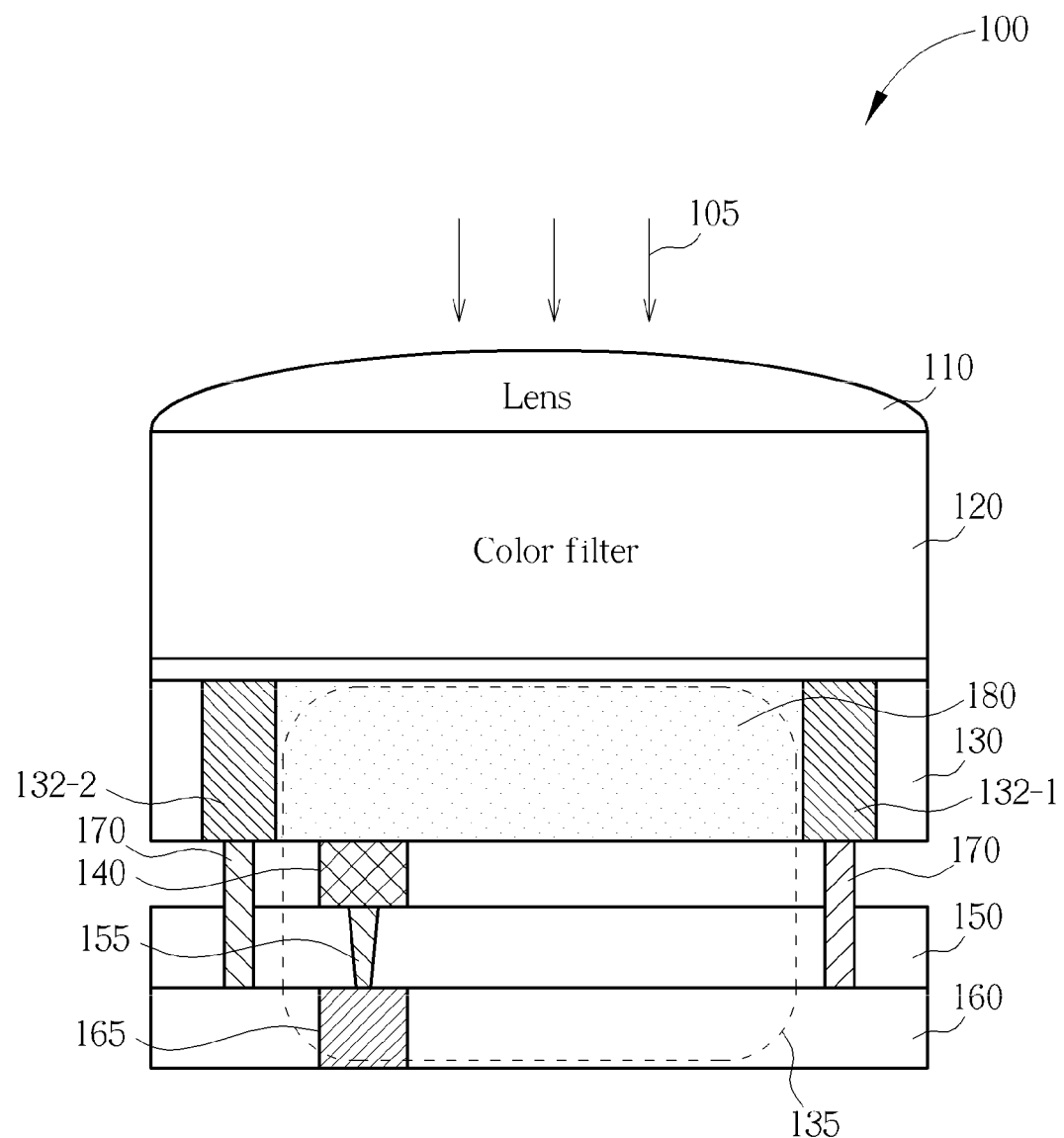
FIG. 1 is a diagram illustrating a BSI CMOS image sensor according to a first embodiment of the present invention.

Please refer to FIG. 1. FIG. 1 is a diagram illustrating a BSI CMOS image sensor according to a first embodiment of the present invention. The BSI CMOS image sensor 100 has a lens 110, a color filter 120, a substrate 130, a first dielectric layer 150, and a first metal wiring layer 160, however, depending on the design requirements, the BSI CMOS image sensor 100 can include numerous elements such as a second metal wiring layer, a third metal wiring layer and dielectric layers in between. Moreover, as is well known by people skilled in this art, a CMOS image sensor can have a plurality of lenses, color filters, and pixels, wherein each of the pixel includes at last a photodiode and at least a transistor. Please note that the structure of the BSI CMOS image sensor 100 in FIG. 1 is for illustrative purposes only and is not meant to be a limitation of the present invention.

In FIG. 1, incident light 105 passes through the lens 110 and the color filter 120 to a pixel 135. The lens 110 is above the substrate 130 and it can be a microlens in a preferred embodiment of the present invention. The pixel 135 includes a photodiode 180 for transferring the photons of light into electric charges accordingly, where there are usually shallow trench isolation (STI) area(s) 132-1 and 132-2 situated on each side of the pixel 135. The BSI CMOS image sensor 100 also has a contact 155 placed in the first dielectric layer 150 which connects a gate structure 140 with a metal wire 165, and the gate structure 140 is a portion of a transistor (not shown) which corresponds to the pixel 135. Since not all the incident light 105 successfully strikes the pixel 135, some of the photons may reflect/refract into adjacent pixels and this leads to cross talk between pixels. For promoting the performance, the BSI CMOS image sensor 100 uses a light shield 170 to guide the incident light 105 to the pixel 135. In this way, light loss can be effectively reduced and annoying cross talk diminished by using the light shield 170 positioned around at least one side of the pixel 135 for guiding at least a portion of the incident light 105 back to the pixel 135 (or the photodiode 180).

For increasing the quantum efficiency of the BSI CMOS image sensor 100, the material of the light shield 170 can be chosen to ensure that the light shield 170 reflects the portion of the incident light striking the light shield 170 back into the pixel 135 and does not absorb the incident light 105. Please note that the material of the light shield 170 is not restricted as long as it fits at least one of the above conditions. For instance, with proper design considerations, the light shield 170 can be made of either solid or liquid material. In one preferred embodiment, the light shield 170 is made of metal. In addition, to reduce the complexity of the fabrication process, the light shield 170 can be made while forming the contact 155, and the material of the light shield 170 can be the same as that selected for the contact 155, thereby reducing the production cost. That is, in some preferred embodiments, the material of the light shield is a metal material that used to form the contact 155. Please note that the location of the light shield 170 and the material of the light shield 170 of the present invention are for illustratively proposes only and not meant to be a limitation of the present invention. For instance, with proper design adjustments, the light shield 135 can be placed in other structure(s) of the BSI CMOS image sensor 100 around the pixel, to reduce light loss and diminish cross talk between the adjacent pixels. All these alternative designs fall within the scope of the present invention.

Figure 2:
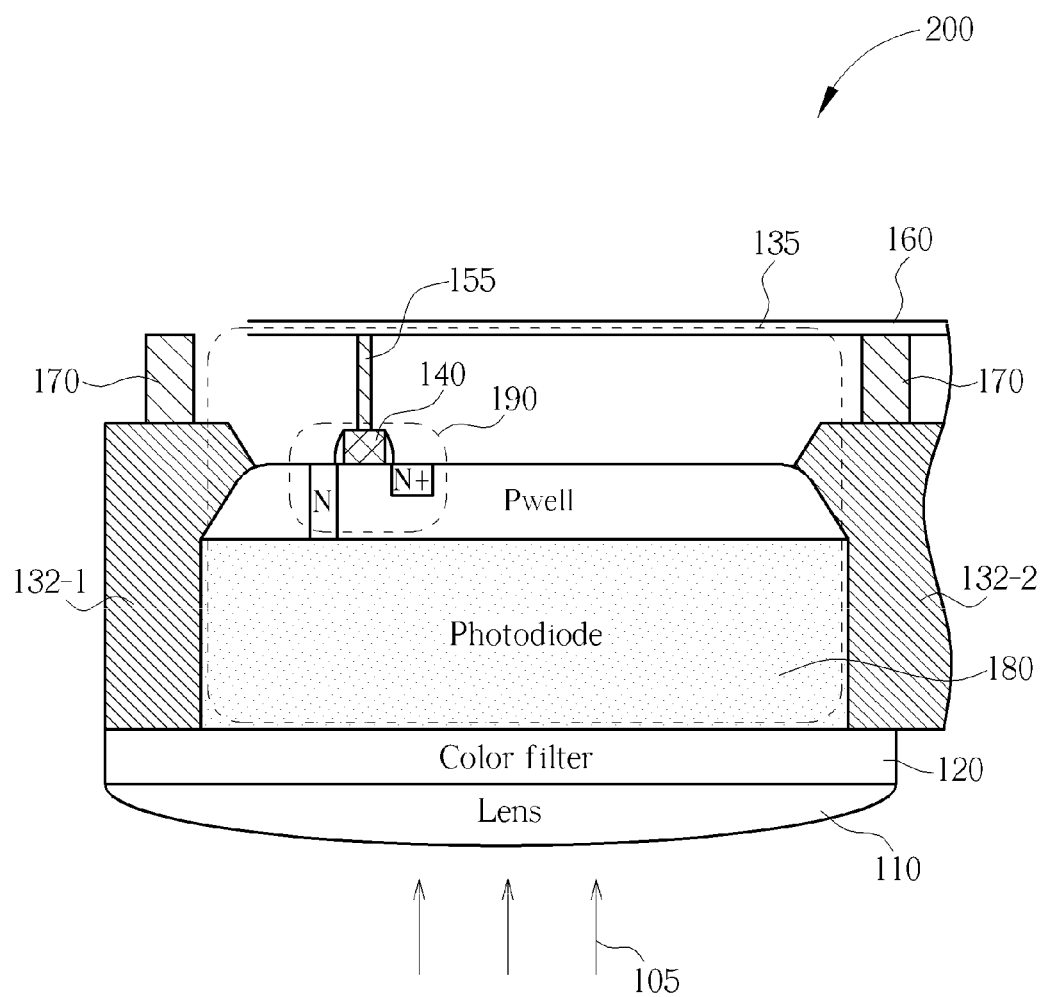
FIG. 2 is a diagram illustrating implementation details of the BSI CMOS image sensor according to a first exemplary embodiment shown in FIG. 1.

Please refer to FIG. 2. FIG. 2 is a diagram illustrating implementation details of the BSI CMOS image sensor of a first embodiment shown in FIG. 1. In the BSI CMOS image sensor 200 the incident light 105 is guided to strike the pixel 135 through the color filter 120 via the light shield 170. The light shield 170 is placed around the pixel 135 to block most of the incident light 105 and makes the portion of the incident light 105 that strikes the light shield 170 be reflected back into the pixel 135, thereby promoting quantum efficiency and reducing the cross talk of the BSI CMOS image sensor 100. In addition, the pixel 135 includes a photodiode 180 and a transistor 190, and a gate structure 140 is a proportion of the transistor 190. Herein the light shield 170 is made while forming the contact 155, and the material of the light shield 170 can be chose to be the same at that of the contact 155.

In addition, in FIG. 2, the gate structure 140 which is connected to a metal wire (not shown) via a contact 155. Moreover, in some preferred embodiments, for further improving the performance of the BSI CMOS image sensor 200, the material of the light shield 170 can be chosen not to absorb the incident light to further reduce light loss. That is, the material of the light shield 170 can vary depending on the design requirements, for instance, if needed, the light shield 170 can be made of either liquid or solid material. Besides BSI CMOS image sensors, the present invention can also be applied to the FSI technology in the manufacturing of FSI CMOS image sensors.

Figure 3:
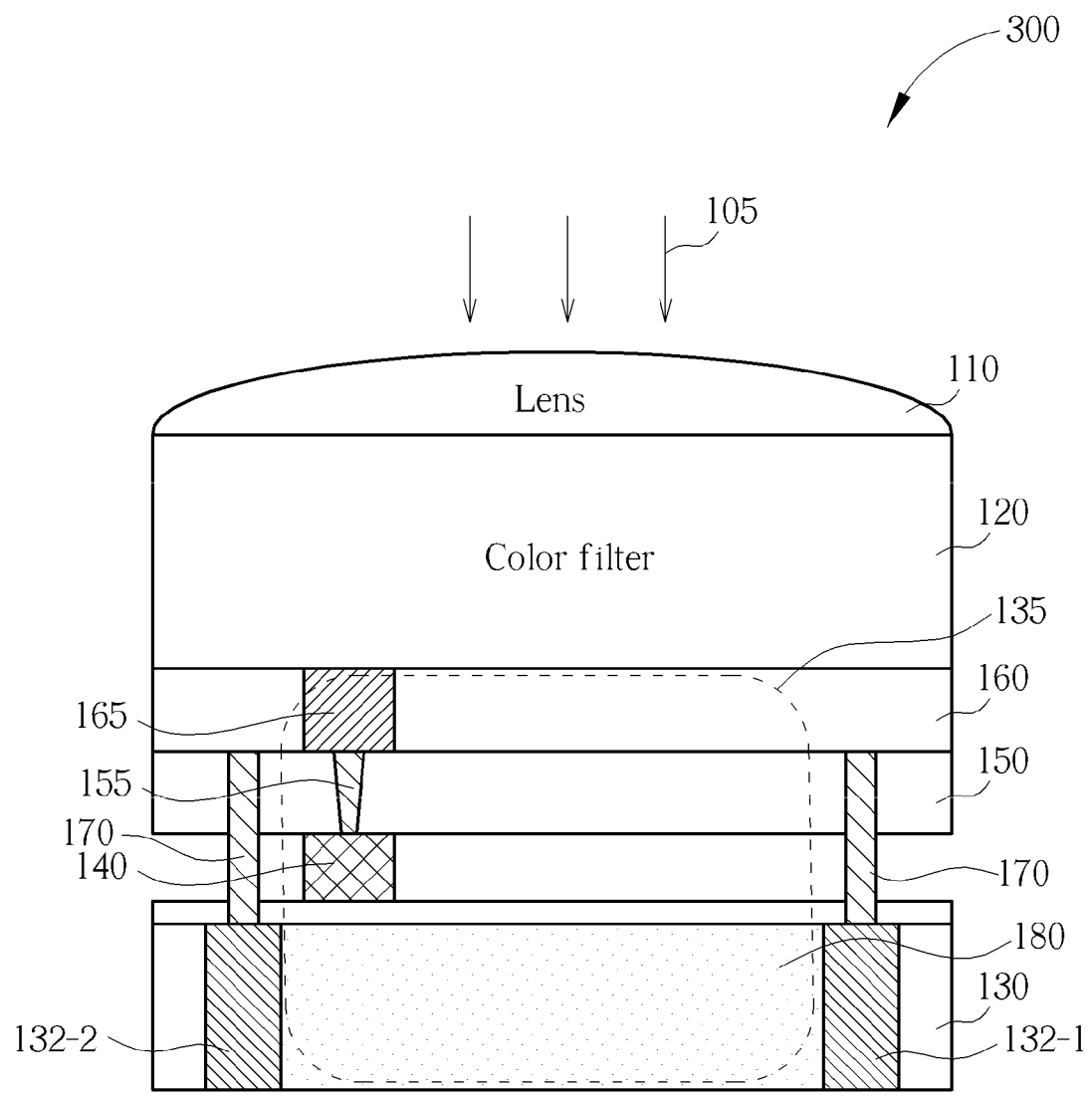
FIG. 3 is a diagram illustrating a FSI CMOS image sensor according to a second embodiment of the present invention.

Please refer to FIG. 3. FIG. 3 is a diagram illustrating a FSI CMOS image sensor 300 according to a second embodiment of the present invention. The FSI CMOS image sensor 300 has a lens 110, a color filter 120, a substrate 130, a first dielectric layer 150, and a first metal wiring layer 160. The pixel 135 is used for transferring the photons into electric charges accordingly, where shallow trench isolation (STI) area(s) 132-1 and 132-2 are situated on each side of the pixel 135. The FSI CMOS image sensor 300 further includes a contact 155, a gate structure 140 and a metal wire 165. And the gate structure 140 is a portion of a transistor (not shown), wherein the pixel 135 includes a photodiode 180 and the transistor. Since the structure and the operations of the FSI CMOS image sensor 300 are well known by people skilled in this art, and the differences between the BSI CMOS image sensors and the FSI CMOS image sensors are disclosed in previous paragraphs, further description is omitted here for the sake of brevity.

Similar to the aforementioned BSI CMOS image sensor 100 in the first exemplary embodiment, in FIG. 3, the light shield 170 is placed around the pixel 135. Furthermore, the light shield 170 is made while forming the contact 155, and the material of the light shield 170 can be chose the same as that of the contact 155. In some preferred embodiments, the material of the light shield is a metal material that used to form the contact 155. However, the material of the light shield 170 can vary depending on the design requirements, for instance, it can be made of either solid or liquid material. In fact, all material capable of reflecting the incident light 105 back to the pixel 135 can be chosen to make the light shield 170. Moreover, the material of the light shield 170 can be further selected so that the light shield 170 does not absorb the incident light 105 to further promote quantum efficiency and reduce cross talk.

In addition, when the material of the light shield 170 is the same as that selected for the contact 155, the production cost thereby is reduced. Furthermore, the shape of the light shield 170 is allowed to vary depending on the design requirements. All these alternative designs fall within the scope of the present invention.

Figure 4:
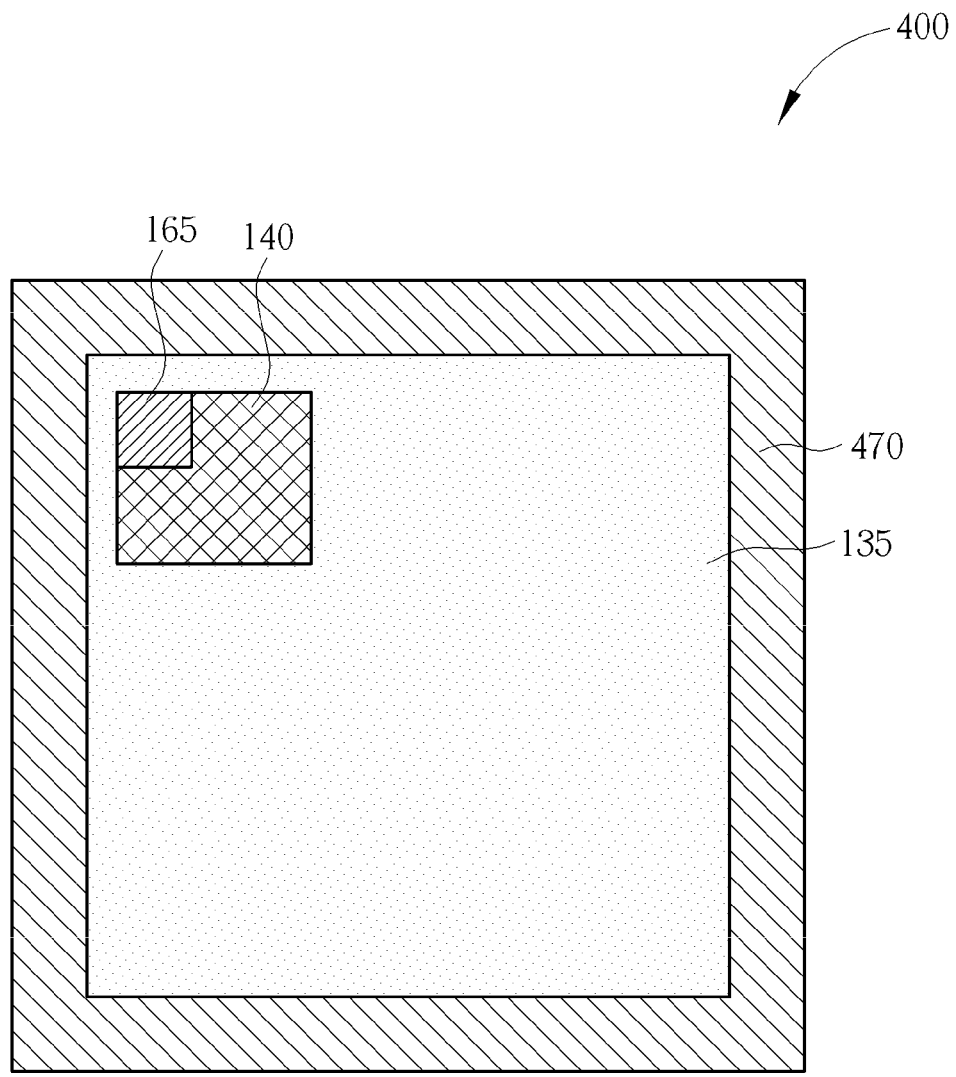
FIG. 4 is diagram illustrating a top view of a CMOS image sensor of the present invention.
Figure 5:
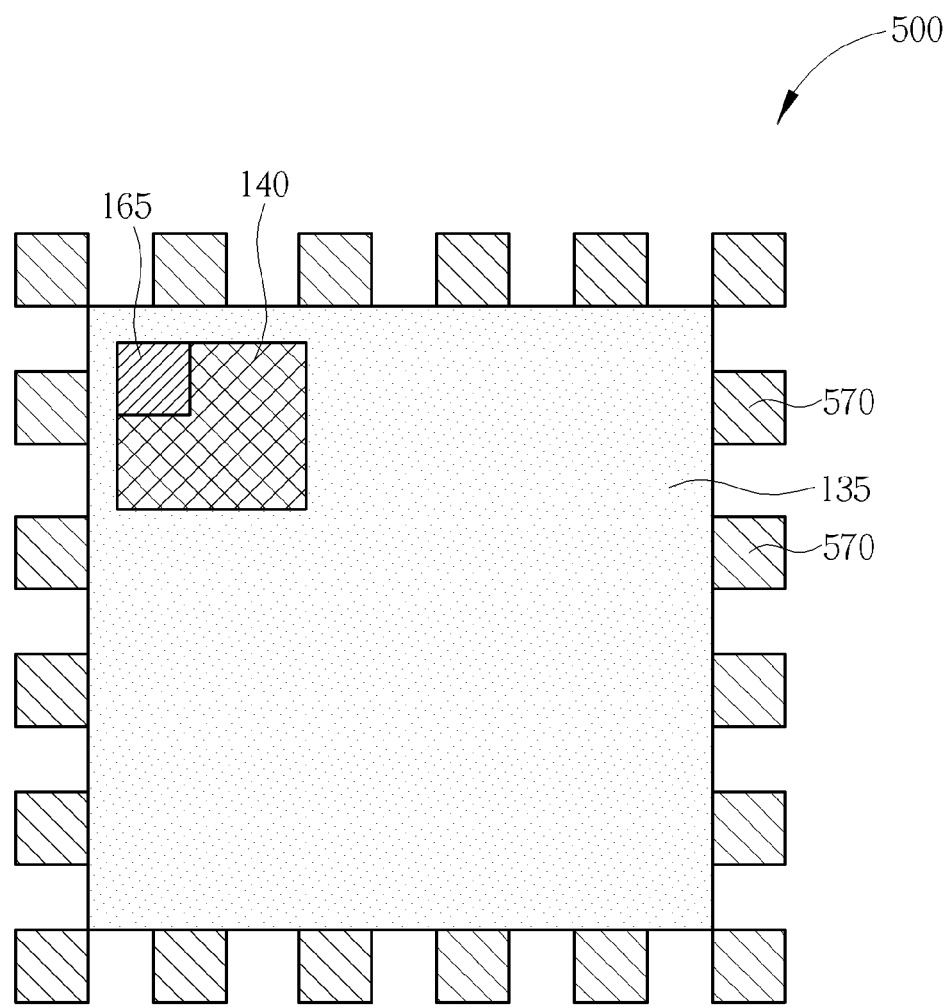
FIG. 5 is diagram illustrating a top view of a CMOS image sensor of the present invention.

Please refer to FIG. 4 and FIG. 5 in conjunction with FIG. 1~FIG. 3. FIG. 4 is a diagram illustrating a top view of a CMOS image sensor of the present invention. FIG. 5 is a diagram illustrating a top view of a CMOS image sensor according to another embodiment of the present invention. In FIG. 4, the light shield 470 of the CMOS image sensor 400 is a slot-shaped sidewall and in FIG. 5, the light shield 570 of the CMOS image sensor 500 is an island-shaped sidewall. Moreover, as previously mentioned, the shape of the light shield of the present invention can vary depending on the design requirements. For instance, in a further embodiment of the present invention, the light shield is finger-shaped. The aforementioned descriptions of the shapes of the light shields of the present invention are for illustratively purposes only, all the alternative shapes of the light shields can promote the performance of the image sensors of the present invention obey and fall within the scope of the present invention.

In addition, the location of the light shield(s) is not restricted, it can be placed around at least one side of the pixel anywhere within the pixel of the CMOS image sensors. All these alternative designs obeying the spirit of the present invention fall within the scope of the present invention.

Those skilled in the art will readily observe that numerous modifications and alterations of the device and method may be made while retaining the teachings of the invention.

What is claimed is:
1. An image sensor, comprising:
a substrate;
at least a pixel, wherein the pixel includes a photodiode and at least a transistor, and the transistor is connected to a metal line via a contact; and
at least a light shield, positioned around at least one side of the pixel, wherein the light shield is made while forming the contact, and the light shield is liquid;
wherein the image sensor further has a shallow trench isolation (STI) area placed outside the photodiode, and the light shield is placed on the STI area.

2. The image sensor of claim 1, wherein the light shield reflects at least the portion of the incident light striking the light shield back to the pixel.

3. The image sensor of claim 1, wherein the light shield does not absorb the portion of the incident light striking the light shield.

4. The image sensor of claim 1, wherein the light shield is an island-shaped sidewall.

5. The image sensor of claim 1, wherein the light shield is a slot-shaped sidewall.

6. The image sensor of claim 1, wherein the light shield is a finger-shaped sidewall.

7. The image sensor of claim 1, wherein the image sensor employs a back side illumination (BSI) technology.

8. The image sensor of claim 1, wherein the image sensor is a Complementary Metal Oxide semiconductor (CMOS) sensor.

9. The image sensor of claim 1, further comprising a metal layer above the light shield at the front side of the pixel.

10. The image sensor of claim 1, further comprising a lens at the back side of the pixel.

* * * * *